(12) United States Patent
Chinnusamy et al.

(10) Patent No.: US 9,875,988 B2
(45) Date of Patent: Jan. 23, 2018

(54) SEMICONDUCTOR DEVICE AND METHOD OF FORMING DCALGA PACKAGE USING SEMICONDUCTOR DIE WITH MICRO PILLARS

(71) Applicant: Semtech Corporation, Camarillo, CA (US)

(72) Inventors: Satyamoorthi Chinnusamy, San Jose, CA (US); Weng Hing Tan, San Jose, CA (US); Andrew Pan, Shanghai (CN); Kok Khoon Ho, San Jose, CA (US)

(73) Assignee: Semtech Corporation, Camarillo, CA (US)

( * ) Notice: Subject to any disclaimer, the term of this patent is extended or adjusted under 35 U.S.C. 154(b) by 0 days.

(21) Appl. No.: 14/927,361

(22) Filed: Oct. 29, 2015

(65) Prior Publication Data

US 2017/0125375 A1 May 4, 2017

(51) Int. Cl.
*H01L 21/44* (2006.01)
*H01L 25/065* (2006.01)
(Continued)

(52) U.S. Cl.
CPC .......... *H01L 25/065* (2013.01); *H01L 21/486* (2013.01); *H01L 21/4825* (2013.01); *H01L 21/4882* (2013.01); *H01L 21/56* (2013.01); *H01L 21/565* (2013.01); *H01L 23/3107* (2013.01); *H01L 23/367* (2013.01); *H01L 23/49541* (2013.01); *H01L 23/49827* (2013.01); *H01L 23/552* (2013.01); *H01L 24/13* (2013.01); *H01L 25/50* (2013.01); *H01L 21/561* (2013.01);
(Continued)

(58) Field of Classification Search
CPC ....... H01L 25/065; H01L 25/50; H01L 21/56; H01L 21/565; H01L 21/4825; H01L 21/4882
USPC .......................... 257/778; 438/112, 127, 108
See application file for complete search history.

(56) References Cited

U.S. PATENT DOCUMENTS 5,147,084 A * 9/1992 Behun ..................... G01R 31/04
174/259
5,261,593 A * 11/1993 Casson ............... H01L 23/4985
228/180.22

(Continued)

*Primary Examiner* — Nitin Parekh
(74) *Attorney, Agent, or Firm* — Robert D. Atkins; Patent Law Group: Atkins and Associates, P.C.

(57) ABSTRACT

A semiconductor device has a first semiconductor die disposed over a substrate. A plurality of composite interconnect structures are formed over the semiconductor die. The composite interconnect structures have a non-fusible conductive pillar and a fusible layer formed over the non-fusible conductive pillar. The fusible layer is reflowed to connect the first semiconductor die to a conductive layer of the substrate. The non-fusible conductive pillar does not melt during reflow eliminating a need to form a solder resist over the substrate. An encapsulant is deposited around the first semiconductor die and composite interconnect structures. The encapsulant flows between the active surface of the first semiconductor die and the substrate. A second semiconductor die is disposed over the substrate adjacent to the first semiconductor die. A heat spreader is disposed over the first semiconductor die. A portion of the encapsulant is removed to expose the heat spreader.

25 Claims, 9 Drawing Sheets

(51) Int. Cl.
*H01L 21/48* (2006.01)
*H01L 21/56* (2006.01)
*H01L 23/31* (2006.01)
*H01L 23/367* (2006.01)
*H01L 23/495* (2006.01)
*H01L 23/498* (2006.01)
*H01L 25/00* (2006.01)
*H01L 23/552* (2006.01)
*H01L 23/29* (2006.01)
*H01L 23/433* (2006.01)
*H01L 23/00* (2006.01)

(52) U.S. Cl.
CPC ........ *H01L 23/295* (2013.01); *H01L 23/3121* (2013.01); *H01L 23/3192* (2013.01); *H01L 23/4334* (2013.01); *H01L 24/11* (2013.01); *H01L 24/16* (2013.01); *H01L 24/81* (2013.01); *H01L 24/97* (2013.01); *H01L 2224/05008* (2013.01); *H01L 2224/05548* (2013.01); *H01L 2224/05567* (2013.01); *H01L 2224/05569* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05664* (2013.01); *H01L 2224/1132* (2013.01); *H01L 2224/1145* (2013.01); *H01L 2224/1146* (2013.01); *H01L 2224/1147* (2013.01); *H01L 2224/11452* (2013.01); *H01L 2224/13005* (2013.01); *H01L 2224/13013* (2013.01); *H01L 2224/13014* (2013.01); *H01L 2224/13022* (2013.01); *H01L 2224/13082* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13166* (2013.01); *H01L 2224/13184* (2013.01); *H01L 2224/16057* (2013.01); *H01L 2224/16238* (2013.01); *H01L 2224/32245* (2013.01); *H01L 2224/73253* (2013.01); *H01L 2224/81011* (2013.01); *H01L 2224/81024* (2013.01); *H01L 2224/81191* (2013.01); *H01L 2224/81815* (2013.01); *H01L 2224/94* (2013.01); *H01L 2224/97* (2013.01); *H01L 2924/3841* (2013.01)

(56) References Cited

U.S. PATENT DOCUMENTS

| | | | |
|---|---|---|---|
| 5,448,114 A * | 9/1995 | Kondoh | H01L 21/563 257/737 |
| 5,969,426 A * | 10/1999 | Baba | H01L 21/568 257/666 |
| 5,977,626 A | 11/1999 | Wang et al. | |
| 6,050,832 A * | 4/2000 | Lee | H01L 23/49833 257/E23.063 |
| 6,163,956 A * | 12/2000 | Corisis | H01L 23/3672 257/E21.511 |
| 6,198,169 B1 * | 3/2001 | Kobayashi | H01L 24/11 257/737 |
| 6,365,500 B1 * | 4/2002 | Chang | H01L 24/10 257/E21.511 |
| 6,563,712 B2 * | 5/2003 | Akram | H01L 23/3121 165/185 |
| 6,653,730 B2 * | 11/2003 | Chrysler | H01L 23/36 257/704 |
| 6,660,560 B2 | 12/2003 | Chaudhuri et al. | |
| 6,943,058 B2 | 9/2005 | Chaudhuri et al. | |
| 7,906,857 B1 | 3/2011 | Hoang et al. | |
| 2001/0013423 A1 | 8/2001 | Dalal et al. | |
| 2003/0049411 A1 | 3/2003 | Chaudhuri et al. | |
| 2003/0183947 A1 * | 10/2003 | Ohuchi | H01L 21/56 257/778 |
| 2004/0035909 A1 | 2/2004 | Yeh et al. | |
| 2005/0087852 A1 * | 4/2005 | Chen | H01L 21/565 257/686 |
| 2008/0265412 A1 * | 10/2008 | Hasegawa | H01L 21/561 257/737 |
| 2009/0039514 A1 * | 2/2009 | Jobetto | H01L 21/56 257/758 |
| 2010/0159645 A1 * | 6/2010 | Yanagida | H01L 21/56 438/113 |
| 2010/0187659 A1 * | 7/2010 | Miyata | H01L 23/3114 257/619 |
| 2010/0246152 A1 | 9/2010 | Lin et al. | |
| 2011/0084386 A1 | 4/2011 | Pendse | |
| 2011/0117700 A1 * | 5/2011 | Weng | H01L 21/56 438/109 |
| 2012/0273935 A1 * | 11/2012 | Martens | H01L 24/13 257/737 |
| 2012/0286408 A1 | 11/2012 | Warren et al. | |
| 2013/0087366 A1 | 4/2013 | Michael et al. | |
| 2013/0334685 A1 * | 12/2013 | Kim | H01L 23/5389 257/738 |
| 2014/0038353 A1 * | 2/2014 | Kim | H01L 24/96 438/107 |
| 2014/0131856 A1 | 5/2014 | Do et al. | |

* cited by examiner

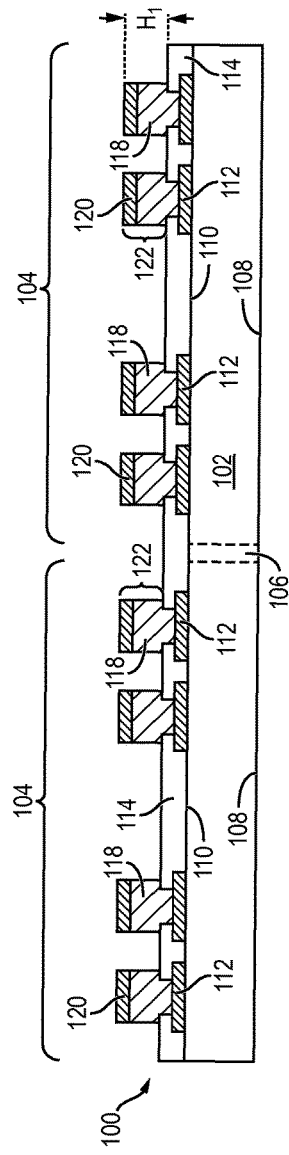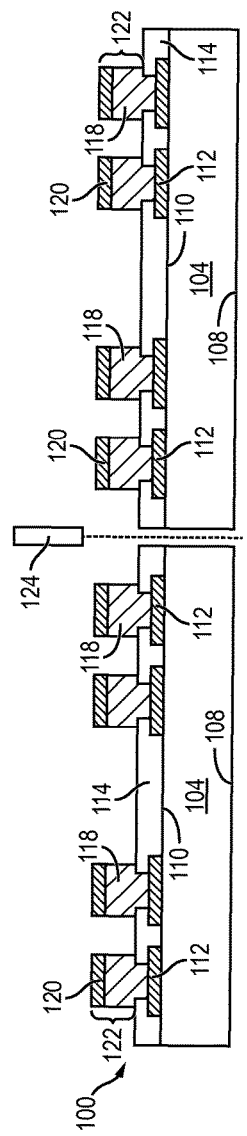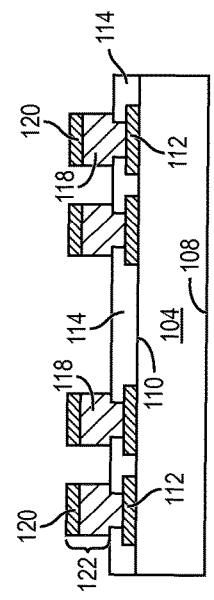

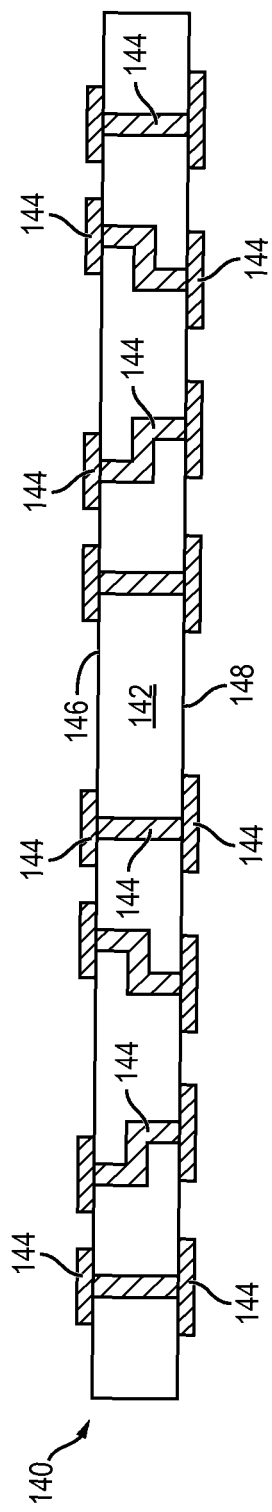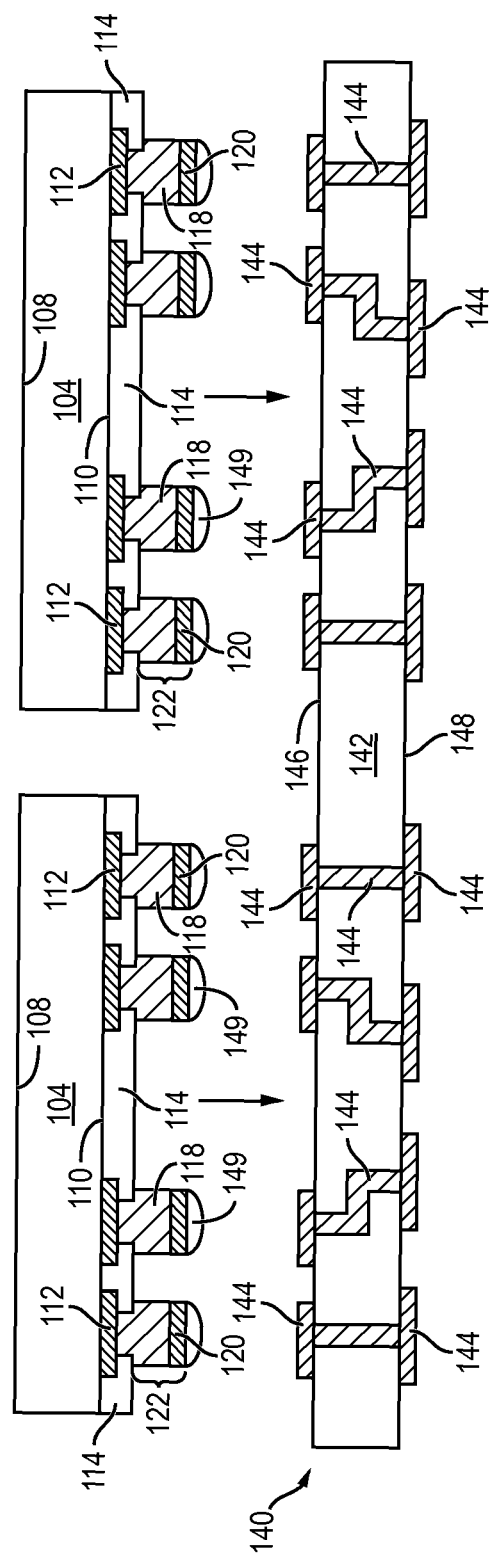
FIG. 5a
FIG. 5b

SEMICONDUCTOR DEVICE AND METHOD OF FORMING DCALGA PACKAGE USING SEMICONDUCTOR DIE WITH MICRO PILLARS

FIELD OF THE INVENTION

The present invention relates in general to semiconductor devices and, more particularly, to a semiconductor device and method of forming a direct chip attach land grid array (DCALGA) package with semiconductor die having micro pillars.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, and various signal processing circuits.

Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows the material's electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support, electrical interconnect, and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A reduced package profile is of particular importance for packaging in the smart phone, wearable technology, and the internet of things (IoT) industries. A smaller semiconductor die size can be achieved by improvements in the front-end process resulting in semiconductor die with smaller, higher density active and passive components. Back-end processes can result in semiconductor device packages with a smaller footprint by improvements in electrical interconnection and packaging materials.

The manufacturing of smaller semiconductor devices relies on implementing improvements to horizontal and vertical electrical interconnection between a semiconductor die and underlying substrate and between multiple semiconductor die disposed over a single substrate. A flip chip package is formed by mounting a semiconductor die in a flip chip orientation to a substrate. The substrate provides electrical interconnection between the semiconductor die and external devices. However, a reduction in package height and throughput time for current flip chip packages is constrained by the thickness of the substrate and the height of the interconnections formed between the flip chip and substrate.

SUMMARY OF THE INVENTION

A need exists to decrease package size and manufacturing time while increasing performance speed and reliability. Accordingly, in one embodiment, the present invention is a method of making a semiconductor device comprising the steps of providing a substrate, disposing a first semiconductor die including a composite interconnect structure comprising a fusible portion and non-fusible portion over the substrate, reflowing the fusible portion of the composite interconnect structure, and depositing an encapsulant around the first semiconductor die.

In another embodiment, the present invention is a method of making a semiconductor device comprising the steps of providing a substrate, disposing a first semiconductor die including a composite interconnect structure comprising a fusible portion and non-fusible portion over the substrate, and reflowing the fusible portion of the composite interconnect structure.

In another embodiment, the present invention is a semiconductor device comprising a substrate and a first semiconductor die including a composite interconnect structure disposed over the substrate. An encapsulant is deposited around the first semiconductor die.

In another embodiment, the present invention is a semiconductor device comprising a substrate and a first semiconductor die including a composite interconnect structure disposed over the substrate.

BRIEF DESCRIPTION OF THE DRAWINGS

FIGS. 1a-1f illustrate a method of forming semiconductor die with micro pillars;

FIG. 2 illustrates a semiconductor die with micro pillars;

FIGS. 5a-5f illustrate a method of forming a DCALGA package using semiconductor die with micro pillars;

DETAILED DESCRIPTION OF THE DRAWINGS

Figure 1A:
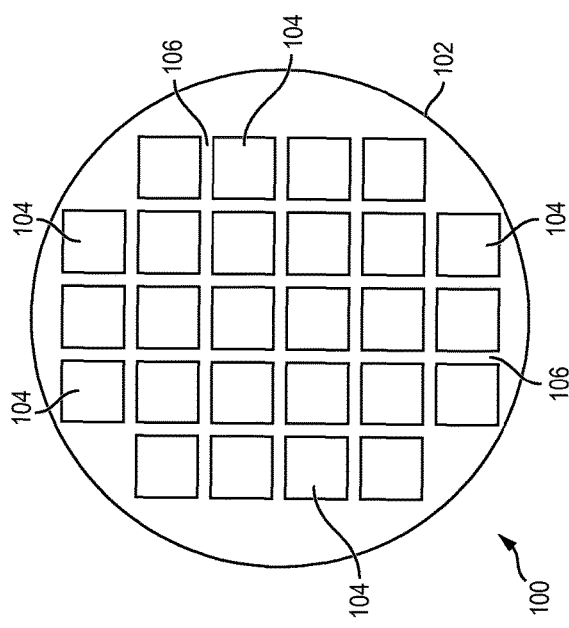

The present invention is described in one or more embodiments in the following description with reference to the figures, in which like numerals represent the same or similar elements. While the invention is described in terms of the best mode for achieving objectives of the invention, those skilled in the art will appreciate that the disclosure is intended to cover alternatives, modifications, and equivalents as may be included within the spirit and scope of the invention as defined by the appended claims and claim equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk semiconductor material for structural support. A plurality of semiconductor die or components 104 is formed on wafer 100. Semiconductor die 104 are separated by a non-active, inter-die wafer area or saw street 106 as described above. Saw street 106 provides cutting areas to singulate semiconductor wafer 100 into individual semiconductor die 104.

Figure 1B:
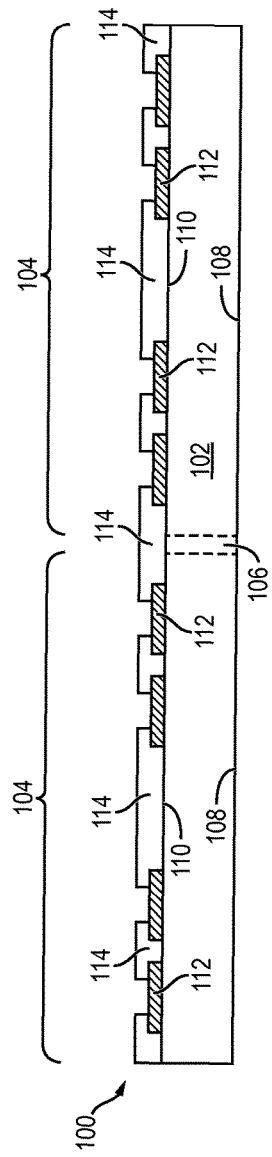

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit includes one or more transistors, diodes, and other circuit elements formed within active surface 110 to implement analog circuits or digital circuits, such as digital signal processor (DSP), ASIC, MEMS, memory, or other signal processing circuit. Semiconductor die 104 can also contain integrated passive devices (IPDs), such as inductors, capacitors, and resistors, for radio frequency (RF) signal processing.

An electrically conductive layer 112 is formed over active surface 110 using PVD, CVD, electrolytic plating, electroless plating process, or other suitable metal deposition process. Conductive layer 112 includes one or more layers of aluminum (Al), copper (Cu), tin (Sn), nickel (Ni), gold (Au), silver (Ag), Palladium (Pd), SnAg, SnAgCu, CuNi, CuNiAu, CuNiPdAu, or other suitable electrically conductive material or combination thereof. Conductive layer 112 operates as contact pads electrically connected to the circuits on active surface 110. Contact pads 112 facilitate electrical interconnect between active circuits within semiconductor die 104 and external devices, for example, a printed circuit board (PCB).

An insulating or passivation layer 114 is formed over active surface 110 and contact pads 112 using PVD, CVD, screen printing, spin coating, spray coating, sintering, or thermal oxidation. Passivation layer 114 contains one or more layers of silicon dioxide (SiO2), silicon nitride (Si3N4), silicon oxynitride (SiON), tantalum pentoxide (Ta2O5), aluminum oxide (Al2O3), hafnium oxide (HfO2), benzocyclobutene (BCB), polyimide (PI), polybenzoxazoles (PBO), polymer, or other material having similar insulating and structural properties. Passivation layer 114 covers and provides protection for active surface 110. Passivation layer 114 is formed over and around contact pads 112 for electrical isolation. A plurality of openings is formed in passivation layer 114 over contact pads 112 by etching, laser direct ablation (LDA), or other suitable process. The openings in passivation layer 114 expose contact pads 112 for subsequent electrical interconnection.

Figure 1C:
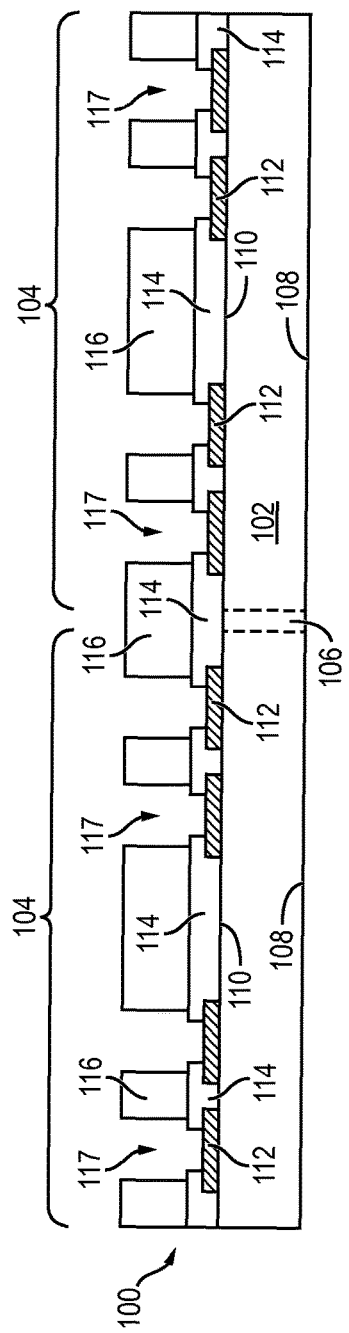

In FIG. 1c, a patterning or photoresist layer 116 is formed over passivation layer 114 and contact pads 112 using printing, spin coating, spray coating, or other suitable method. A portion of photoresist layer 116 is removed by etching, LDA, or other suitable process to form openings 117. Openings 117 are formed over passivation layer 114 and contact pads 112. Openings 117 expose and extend to contact pads 112. In one embodiment, patterned openings 117 have a circular cross-sectional area configured to form conductive pillars with a cylindrical shape including a circular cross-section. In another embodiment, patterned openings 117 have a rectangular cross-sectional area configured to form conductive pillars with a cubic shape including a rectangular cross-section.

Figure 1D:
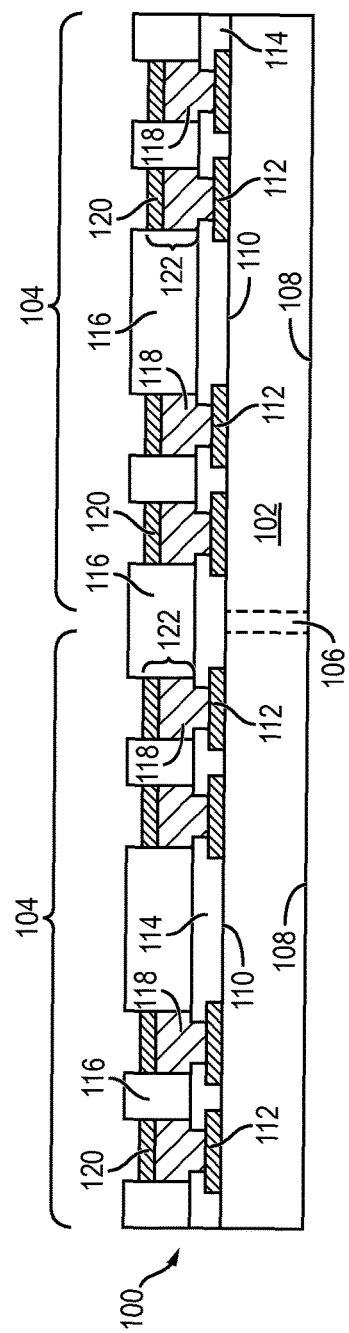

In FIG. 1d, an electrically conductive material is deposited within openings 117 and over contact pads 112 using an evaporation, sputtering, electrolytic plating, electroless plating, screen printing process to form conductive pillars or columns 118. Conductive pillars 118 include one or more layers of Al, Cu, Sn, titanium (Ti), Ni, Au, Ag, tungsten (W), or other suitable electrically conductive material. In one embodiment, conductive pillars 118 are formed by plating Cu in patterned openings 117 of photoresist layer 116. Conductive pillars 118 are electrically connected to contact pads 112.

An electrically conductive layer or bump material 120 is deposited over conductive pillars 118 using an evaporation, electrolytic plating, electroless plating, ball drop, or screen printing process. Electrically conductive layer 120 includes Al, Sn, Ni, Au, Ag, Pb, Bi, Cu, solder, or combinations thereof. The combination of conductive pillar 118 and conductive layer 120 constitutes a composite interconnect structure or micro pillar 122 with a non-fusible portion (conductive pillar 118) and a fusible portion (conductive layer 120). In one embodiment, the non-fusible portion 118 is a Cu pillar and the fusible layer 120 is SnAg. In another embodiment, non-fusible pillar portion 118 is Cu, and fusible layer 120 includes a Ni and SnAg.

In FIG. 1e, photoresist layer 116 is removed by an etching process to leave individual micro pillars 122. Micro pillars 122 can have a cylindrical shape with a circular or oval cross-section, or micro pillars 122 can have a cubic shape with a rectangular cross-section. Micro pillars 122 have a height H1 of 50 micrometers (μm) or less and have a diameter of 50 μm or less. Micro pillars 122 represent one type of interconnect structure that can be formed over semiconductor die 104. The interconnect structure can also use bumps, conductive paste, stud bumps, or other electrical interconnect.

In FIG. 1f, semiconductor wafer 100 is singulated into individual semiconductor die 104 by cutting through saw street 106 using a saw blade or laser cutting tool 124. FIG. 2 shows semiconductor die 104 after singulation. Micro pillars 122 are formed over and electrically connected to contact pads 112.

Figure 3:
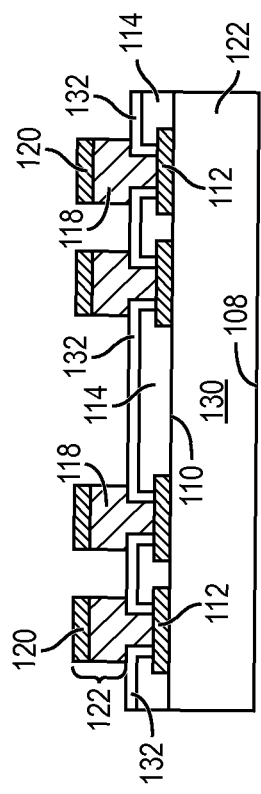
FIG. 3 illustrates a semiconductor die with micro pillars formed over an insulating layer.

FIG. 3 shows a semiconductor die 130, similar to semiconductor die 104 in FIG. 2. Semiconductor die 130 includes an insulating or passivation layer 132 formed over passivation layer 114. Insulating layer 132 is formed over passivation layer 114 and contact pads 112 using PVD, CVD, screen printing, spin coating, spray coating, sintering, or thermal oxidation. Insulating layer 132 contains one or more layers of PI, SiO2, Si3N4, SiON, Ta2O5, Al2O3, HfO2, BCB, PBO, polymer, or other material having similar insulating and structural properties. A portion of insulating layer 132 is removed to form a plurality of openings exposing contact pads 112. The openings in insulating layer 132 are smaller, i.e., narrower, than the openings in passivation layer 114. A portion of insulating layer 132 is disposed in the openings in passivation layer 114 and contacts the surface of contact pads 112.

Micro pillars 122 are formed over insulating layer 132 and the exposed portion of contact pads 112. Non-fusible conductive pillar portion 118 of micro pillar 122 is electrically connected to contact pads 112. Fusible conductive layer 120 is formed over conductive pillars 118. In one embodiment, an under bump metallization (UBM) having an adhesion layer, barrier layer, and seed or wetting layer is formed between conductive pillars 118 and contact pads 112. Insulating layer 132 provides electrical insulation and stress relief to micro pillars 122 over active surface 110.

Figure 4:
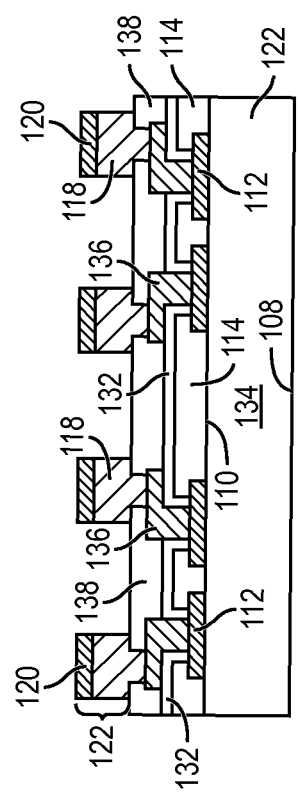
FIG. 4 illustrates a semiconductor die with micro pillars formed over an RDL.

FIG. 4 shows a semiconductor die 134, similar to semiconductor die 130 in FIG. 3. Semiconductor die 134 includes an electrically conductive layer 136. Conductive layer 136 is formed over insulating layer 132 and contact pads 112 using a patterning and metal deposition process such as PVD, CVD, sputtering, electrolytic plating, and electroless plating. Conductive layer 136 includes one or more layers of Al, Cu, Sn, Ni, Au, Ag, Ti, TiW, W, or other suitable electrically conductive material or combination thereof. One portion of conductive layer 136 is electrically connected to contact pads 112 of semiconductor die 134. Other portions of conductive layer 136 are electrically common or electrically isolated depending on the design and function of semiconductor die 134. Conductive layer 136 operates as a redistribution layer (RDL) to redistribute electrical connection laterally across semiconductor die 134, i.e., conductive layer 136 redistributes electrical connection from contact pads 112 to other areas over active surface 110 of semiconductor die 134.

An insulating or passivation layer 138 is formed over insulating layer 132 and conductive layer 136 using PVD, CVD, printing, spin coating, spray coating, sintering, or thermal oxidation. Insulating layer 138 includes one or more layers of SiO2, Si3N4, SiON, Ta2O5, Al2O3, PI, BCB, PBO, or other material having similar insulating and structural properties. A portion of insulating layer 138 is removed by etching, LDA, or other suitable process to expose portions of conductive layer 136.

Micro pillars 122 are formed over insulating layer 138 and the exposed portions of conductive layer 136. Non-fusible conductive pillar portion 118 of micro pillar 122 is electrically connected to conductive layer 136. Fusible conductive layer 120 is formed over conductive pillar 118. In one embodiment, a UBM having an adhesion layer, barrier layer, and seed or wetting layer is formed between conductive pillars 118 and conductive layer 136. Conductive layer 136 redistributes signals across semiconductor die 134 and allows the location and layout of micro pillars 122 to be selected to mirror the location and layout of contact pads on any substrate or leadframe.

Figure 5C:
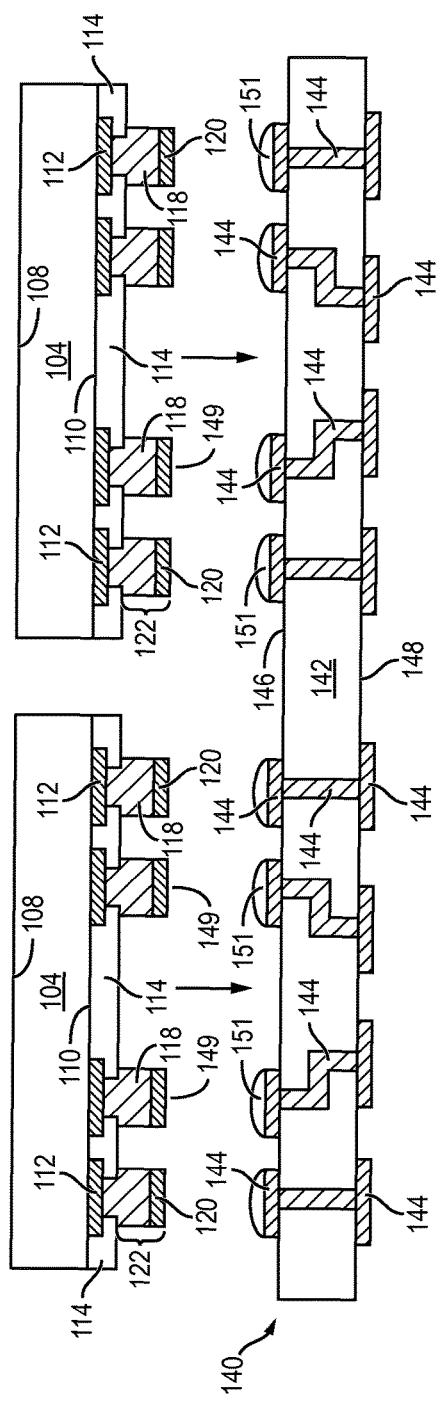

FIGS. 5a-5f illustrate a method of forming a DCALGA package using a semiconductor die with micro pillars. FIG. 5a shows a cross-sectional view of a portion of a substrate or PCB 140 containing insulating material 142 and conductive layers 144. In one embodiment, substrate 140 contains one or more laminated layers of prepreg, FR-4, FR-1, CEM-1, or CEM-3 with a combination of phenolic cotton paper, epoxy, resin, woven glass, matte glass, polyester, and other reinforcement fibers or fabrics. Substrate 140 can also be a leadframe, multi-layer flexible laminate, copper foil, or semiconductor wafer including an active surface containing one or more transistors, diodes, and other circuit elements to implement analog circuits or digital circuits.

The insulating material 142 contains one or more layers of SiO2, Si3N4, SiON, Ta2O5, Al2O3, HfO2, BCB, PI, PBO, polymer, or other dielectric material having similar structural and insulating properties. Conductive layers 144 contain Al, Cu, Sn, Ni, Au, Ag, Ti, W, or other suitable electrically conductive material formed using a patterning and metal deposition process such as sputtering, electrolytic plating, and electroless plating. Conductive layers 144 include lateral RDL and vertical conductive vias that provide electrical interconnect laterally across substrate 140 and vertically between opposing surfaces 146 and 148 of substrate 140. Portions of conductive layers 144 are electrically common or electrically isolated according to the design and function of the semiconductor die and other devices subsequently mounted to substrate 140. Portions of conductive layer 144 on surface 146 provide contact pads for semiconductor die and components mounted over surface 146. Portions of conductive layer 144 on surface 148 form leads for electrical interconnect between substrate 140 and external devices, for example a PCB.

In FIG. 5b, semiconductor die 104, from FIG. 2, are disposed over substrate 140 using, for example, a pick and place operation with active surface 110 oriented toward surface 146 of substrate 140. A flux material 149 is disposed over fusible layer 120 of micro pillars 122. Flux 149 is deposited by dipping micro pillars 122 in a flux bed prior to disposing semiconductor die 104 over substrate 140. In one embodiment, a flux material 151 is formed over conductive layer 144 of substrate 140, as shown in FIG. 5c.

Figure 5D:
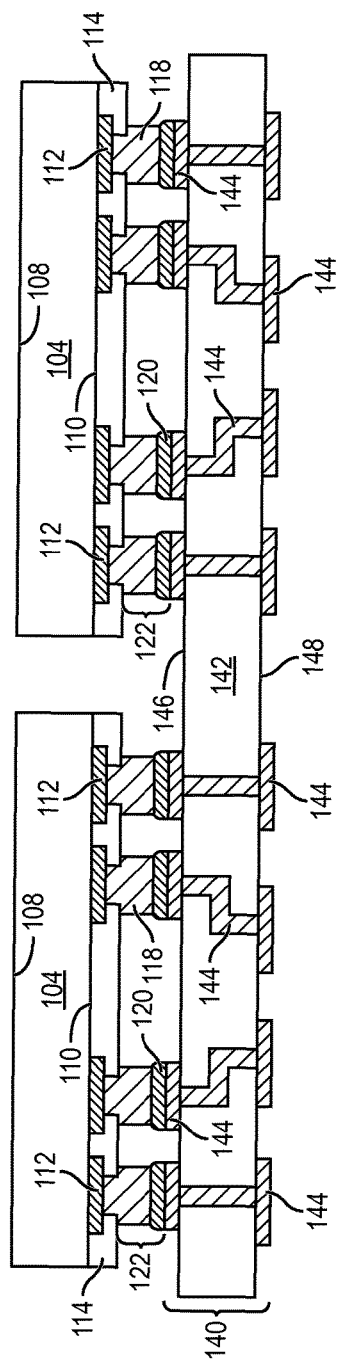

FIG. 5d shows semiconductor die 104 mounted to substrate 140. Fusible layer 120 is brought into physical contact with contact pad 144 for reflow. Fusible layer 120 of micro pillars 122 is reflowed to electrically and metallurgically connect to conductive layer 144 of substrate 140. Fusible layer 120 forms an electrical and metallurgical connection to contact pads 144 upon reflow with heat or application of pressure. Non-fusible pillar 118 is fixed to contact pad 112 of semiconductor die 104. Non-fusible pillar 118 does not melt or deform during reflow. In one embodiment, non-fusible pillar 118 is formed with a material having a higher melting temperature than the material of fusible layer 120. Non-fusible pillar 118 provides a gap between semiconductor die 104 and substrate 140. The height of non-fusible pillar 118 is selected to maintain a fixed offset, or standoff distance, between semiconductor die 104 and surface 146 of substrate 140.

With only fusible layer 120 of micro pillar 122 melting during reflow, a solder resist or solder mask is not needed over conductive layer 144 and surface 146 of substrate 140. With only fusible layer 120 melting during reflow, the volume of liquidus material produced during reflow is reduced. The small amount of fusible material 120 employed by micro pillar 122 reduces a risk of melted material spreading between adjacent portions of conductive layer 144 during reflow, i.e., the reduced volume of melted fusible material 120 prevents a formation conductive bridges or shorts between adjacent traces of conductive layer 144. Eliminating the need to form a solder mask over substrate 140 simplifies the manufacturing process of substrate 140 and decreases manufacturing time and costs. Eliminating solder resist layers also minimizes a thickness of substrate 140, i.e., minimizes the distance between opposing surface 146 and 148 of substrate 140.

Figure 5E:
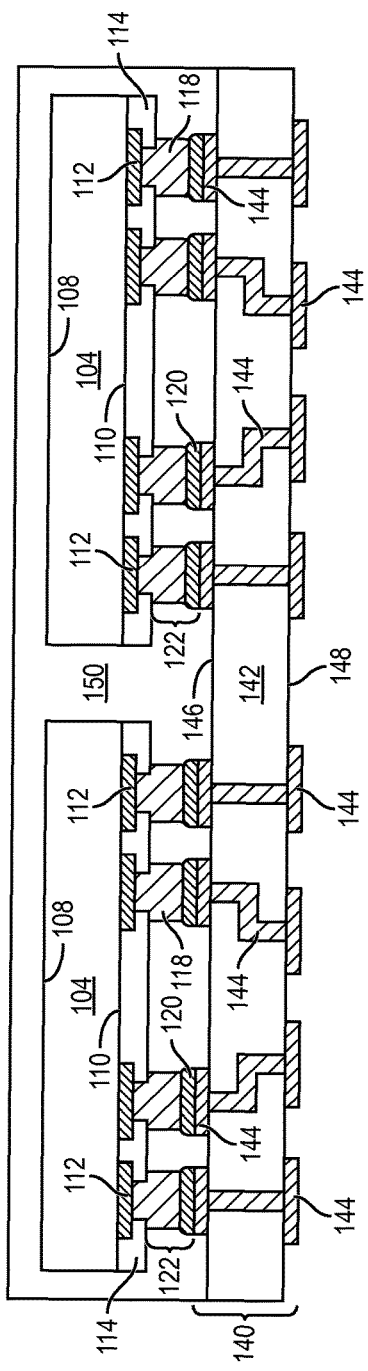

In FIG. 5e, an encapsulant or mold underfill (MUF) material 150 is deposited over semiconductor die 104 and substrate 140 using a vacuum molding, paste printing, compressive molding, transfer molding, liquid encapsulant molding, spin coating, or other suitable application process. MUF material 150 is polymer composite material, such as epoxy resin with filler, epoxy acrylate with filler, or polymer with proper filler. MUF material 150 is non-conductive and environmentally protects semiconductor die 104 from external elements and contaminants.

MUF material 150 is disposed over back surface 108 of semiconductor die 104 and along the four side surfaces of semiconductor die 104. MUF material 150 flows around micro pillars 122 and is disposed between active surface 110 of semiconductor die 104 and surface 146 of substrate. The filler size of MUF material 150 is selected to allow MUF material 150 to flow between active surface 110 of semiconductor die 104 and surface 146 of substrate 140. In one embodiment, MUF material 150 is thinned in a subsequent backgrinding step to expose back surface 108 or alternatively to leave a reduced thickness of MUF material 150 over back surface 108. Alternatively, back surface 108 is exposed from MUF material 150 by controlling the deposition of MUF material 150 to prevent MUF material 150 from flowing over back surface 108.

Figure 5F:
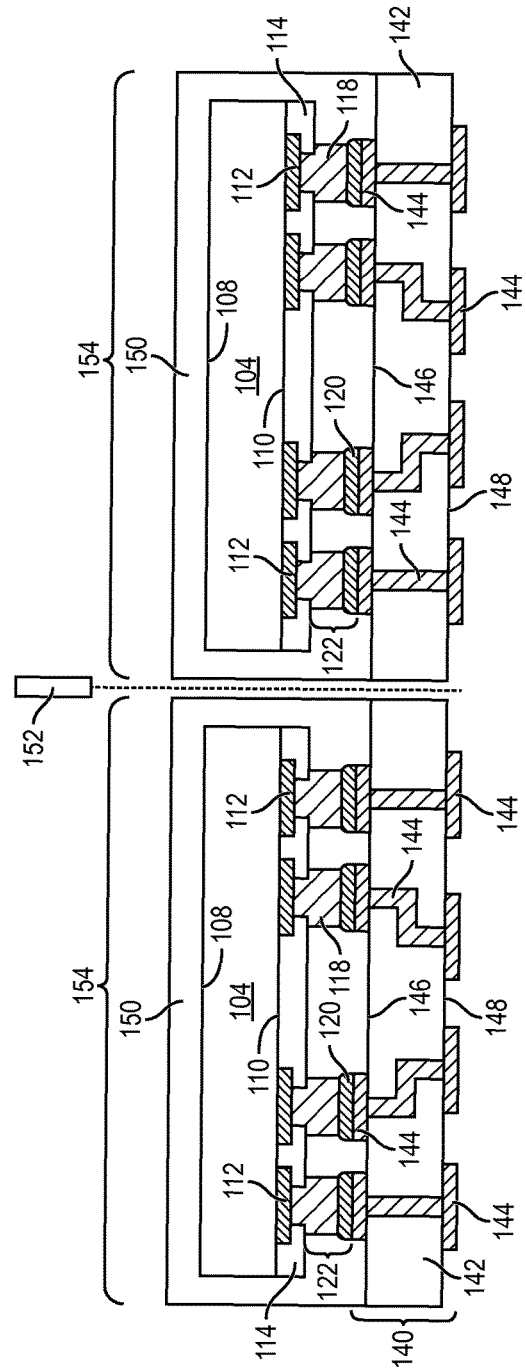
Figure 6A:
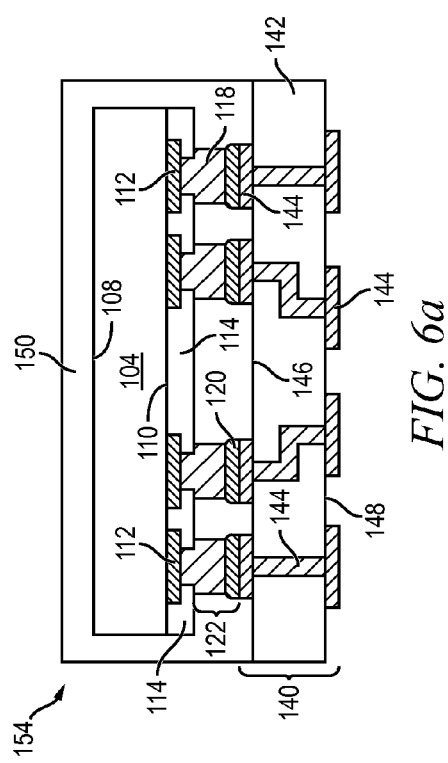
FIGS. 6a-6b illustrate a DCALGA package including a semiconductor die with micro pillars.

In FIG. 5f, a saw blade or laser cutting device 152 cuts through MUF material 150 and substrate 140 to singulate individual DCALGA packages 154. FIG. 6a shows DCALGA package 154 after singulation. Semiconductor die 104 are electrically connected to conductive layers 144 of substrate 140 via micro pillars 122. Semiconductor die 104 is used by way of example in the present embodiment, semiconductor die 130 from FIG. 3 or semiconductor die 134 from FIG. 4 could be used to form DCALGA package 154. Conductive layers 144 provide electrical interconnect laterally across and vertically through substrate 140 according to the design and function of semiconductor die 104. Portions of conductive layer 144 on surface 148 of substrate 140 form land grid array (LGA) leads and provide interconnection between DCALGA package 154 and external devices, for example, a PCB.

Figure 6B:
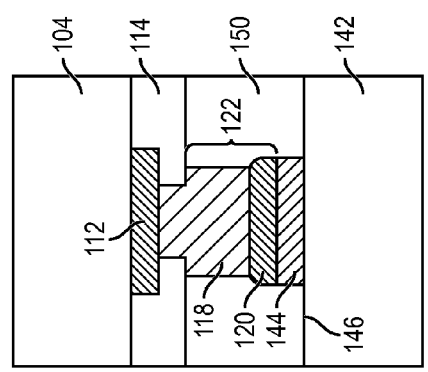

FIG. 6b shows details of the interconnection between a micro pillar 122 of semiconductor die 104 and conductive layer 144 of substrate 140. Non-fusible pillar 118 is fixed to contact pad 112 of semiconductor die 104. Fusible layer 120 is disposed between conductive pillar 118 and contact pad 144 on surface 146 of substrate 140. Reflowed fusible layer 120 forms an electrical and metallurgical connection between pillar 118 and contact pad 144. The reflow of fusible layer 120 is performed at a temperature and pressure selected to prevent pillar 118 from melting or deforming during reflow. Non-fusible pillar 118 provides a fixed offset between semiconductor die 104 and surface 146 of substrate 140.

Micro pillars 122 can be formed with a narrower pitch than for example solder bumps, because only fusible layer 120 is melted during reflow. Melting only fusible layer 120, as opposed to the entire interconnect structure, i.e., conductive pillars 118 and fusible layer 120, reduces the volume of liquidus material during reflow and prevents melted material from spreading between adjacent traces of conductive layer 144. Melting only fusible layer 120 decreases an occurrence of electrical shorts and increases the reliability of DCALGA 154. The decreased pitch of micro pillars 122 also allows a greater number of micro pillars 122 to be formed over semiconductor die 104. Accordingly, semiconductor die and devices with increased input/output density requirements can be incorporated into DCALGA 154.

Employing semiconductor die 104 with micro pillars 122 eliminates a need to form a solder mask or solder resist layer over surface 146 of substrate 140. Substrate 140 does not require a solder mask, because the decreased volume of fusible material, i.e., fusible layer 120, employed by micro pillar 122 does not run a risk spreading between adjacent traces of conductive layer 144 during reflow. Eliminating the need to form a solder mask over substrate 140 simplifies the manufacturing process used to form substrate 140. Eliminating the solder mask formation step also decreases manufacturing time for substrate 140, which increases throughput and decreases an overall cost of DCALGA 154. Additionally, eliminating a solder mask layer from substrate 140 reduces the thickness of substrate 140 and an overall thickness of DCALGA 154.

Mounting semiconductor die 104 with micro pillars 122 directly to conductive layer 144 of substrate 140 minimizes interconnect distance. Minimizing interconnect distance increases package speed. Mounting semiconductor die 104 with micro pillars 122 directly to conductive layer 144 of substrate 140 also minimizes package parasitic elements, e.g., parasitic resistance, capacitance, and inductance (RLC). In one embodiment, fusible layer 120 is comprised of lead-free materials to provide a green, environmentally friendly interconnect structure. Further, the first reflow of fusible layer 120 is performed after disposing semiconductor die 104 over the substrate 140. Eliminating a reflow operation at the wafer level, i.e., prior to singulating semiconductor wafer 100, reduces manufacturing time. Eliminating a reflow operation at the wafer level also increases device reliability, as reducing the number of reflow operations performed over semi conductor die 104 minimizes the number of heating cycles semiconductor die 104 are subjected to. Minimizing the number of heating cycles reduces the risk of warpage and device failures. Thus, DCALGA 154 provides a thinner package having increased reliability, faster performance speeds, and a simplified manufacturing process with reduced costs.

Figure 7:
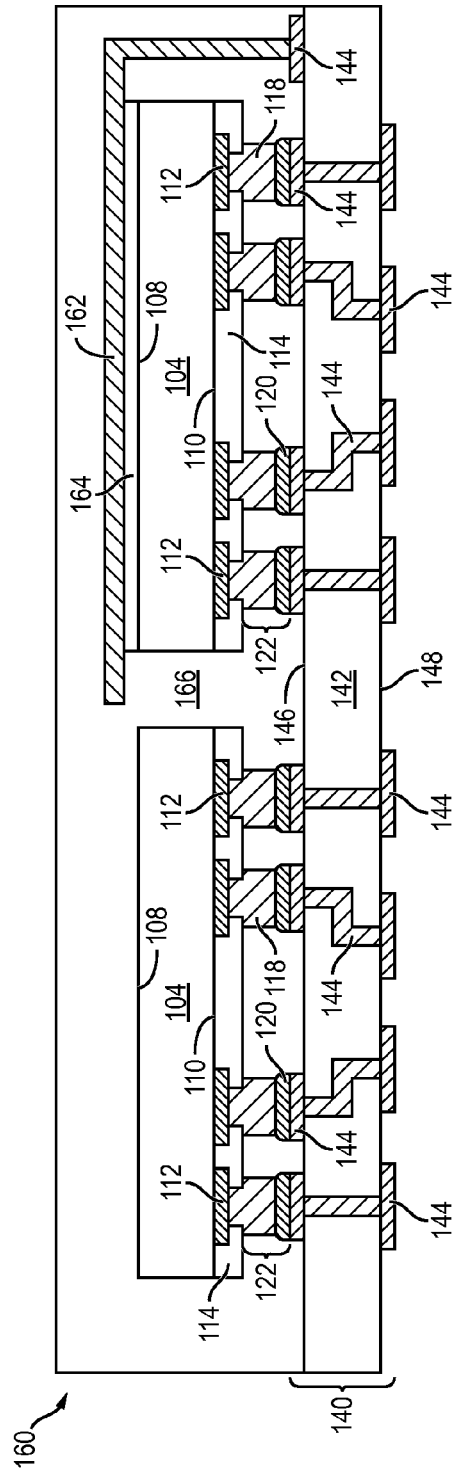
FIG. 7 illustrates a DCALGA package including a heat spreader and multiple semiconductor die with micro pillars.

FIG. 7 illustrates a DCALGA package 160 including a heat spreader and multiple semiconductor die with micro pillars. Semiconductor die 104, from FIG. 2, are disposed over substrate 140 using, for example, a pick and place operation with active surface 110 oriented toward surface 146 of substrate 140. In one embodiment, substrate 140 is a leadframe. A flux material is disposed over micro pillars 122 or over conductive layer 144 of substrate 140 prior to mounting semiconductor die 104. Semiconductor die 104 are used by way of example in the present embodiment, semiconductor die 130 from FIG. 3 and/or semiconductor die 134 from FIG. 4 could also be used to form DCALGA package 160.

Fusible layer 120 of micro pillars 120 is disposed over contact pads of conductive layer 144 on surface 146 of substrate 140. Non-fusible pillar 118 is fixed to contact pad 112 of semiconductor die 104. Fusible layer 120 is reflowed and forms an electrical and metallurgical connection to contact pads 144 on surface 146. Non-fusible pillars 118 do not melt or deform during reflow. Non-fusible pillars 118 provide a fixed offset between semiconductor die 104 and substrate 140. The height of non-fusible pillar 118 is selected to maintain the offset, or standoff, distance between semiconductor die 104 and surface 146 of substrate 140. Semiconductor die 104 are electrically connected to one another via conductive layer 144.

With only fusible layer 120 of micro pillar 122 melting during reflow, a solder resist or solder mask is not needed over conductive layer 144 and surface 146 of substrate 140. The decreased volume of liquidus material produced during reflow of micro pillars 122 does not run a risk spreading between adjacent traces of conductive layer 144 during reflow, i.e., melted fusible layer 120 will not form conductive bridges or shorts between adjacent traces of conductive layer 144. Eliminating the need to form a solder mask over substrate 140 simplifies the manufacturing process for substrate 140 and decreases manufacturing time and costs. Simplifying the manufacturing process and decreasing manufacturing time increase a throughput of DCALGA 160. Eliminating solder resist layers from over surface 146 of substrate 140 also reduces the thickness of substrate 140 and an overall thickness of DCALGA 160.

An electrically conductive layer 162 is formed over at least one of the semiconductor die 104. An adhesive material, thermal interface material (TIM), or insulation layer 164 is disposed between conductive layer 162 and back surface 108 of semiconductor die 104. Conductive layer 162 is electrically connected to conductive layer 144 of substrate 140. In one embodiment, conductive layer 162 acts as a heat spreader to enhance heat dissipation from semiconductor die 104 and improve thermal performance of DCALGA 160. Conductive layer 162 is Cu, Al, or other material with high thermal conductivity. In another embodiment, conductive layer 162 is connected to ground and acts as a shielding layer to block or absorb EMI, RFI, harmonic distortion, and other interference. Forming a shielding layer over semiconductor die 104 improves the electrical performance of DCALGA 160.

An encapsulant or MUF material 166 is deposited over semiconductor die 104, heat spreader 162, and substrate 140 using a vacuum molding, paste printing, compressive molding, transfer molding, liquid encapsulant molding, spin coating, or other suitable application process. MUF material 166 is polymer composite material, such as epoxy resin with filler, epoxy acrylate with filler, or polymer with proper filler. MUF material 166 is non-conductive and environmentally protects semiconductor die and other components from external elements and contaminants.

MUF material 166 is disposed over heat spreader 162, over back surfaces 108 of semiconductor die 104, and around the side surfaces of semiconductor die 104. MUF material 166 flows around heat spreader 162 and micro pillars 122. MUF material 166 is disposed between active surfaces 110 of semiconductor die 104 and surface 146 of substrate 140. The filler size of MUF material 166 is selected to allow MUF material 166 to flow between adjacent semiconductor die 104, and between semiconductor die 104 and substrate 140.

A saw blade or laser cutting device, similar to cutting device 152, is used to cut through MUF material 166 and substrate 140 to singulate individual DCALGA packages 160. FIG. 7 shows DCALGA package 160 after singulation. Semiconductor die 104 are electrically connected to conductive layers 144 of substrate 140 via micro pillars 122. Conductive layers 144 provide electrical interconnect laterally across and vertically through substrate 140 according to the design and function of semiconductor die 104. Portions of conductive layer 144 on surface 148 of substrate 140 form LGA leads, and provide interconnection between DCALGA package 160 and external devices, for example, a PCB.

Non-fusible pillars 118 of micro pillars 122 are fixed to contact pads 112 of semiconductor die 104. Fusible layer 120 of micro pillars 122 is disposed between conductive pillars 118 and contact pads 144 on surface 146 of substrate 140. Reflowed fusible layer 120 forms an electrical and metallurgical connection between conductive pillars 118 and contact pads 144. Non-fusible pillars 118 do not melt or deform during reflow. Non-fusible pillars 118 provide a fixed offset between semiconductor die 104 and surface 146 of substrate 140. The pitch of micro pillars 122 can be reduced because only fusible layer 120 melts during reflow. Melting only fusible layer 120, as opposed to the entire interconnect structure, i.e., conductive pillars 118 and fusible layer 120, decreases the volume of liquidus material during reflow and prevents melted material from spreading between adjacent traces of conductive layer 144. Thus, melting only fusible layer 120 decreases an occurrence of electrical shorts and increases the reliability of DCALGA 160. The decreased pitch of micro pillars 122 also allows a greater number of micro pillars 122 to be formed over semiconductor die 104. Accordingly, semiconductor die and devices with increased input/output density requirements can be incorporated into DCALGA 160.

Substrate 140 does not require a solder resist or solder mask over conductive layer 144 and surface 146 of substrate 140, as the small amount of fusible material 120 employed by micro pillar 122 does not run a risk spreading between adjacent traces of conductive layer 144 during reflow, i.e., melted material fusible layer 120 will not cause conductive bridges or shorts between adjacent traces of conductive layer 144. Eliminating the need to form a solder mask over substrate 140 simplifies the manufacturing process for substrate 140. Eliminating the need to form a solder mask over substrate 140 decreases manufacturing time and costs, which increase throughput. Eliminating a solder mask layer also reduces the thickness of substrate 140 and an overall thickness of DCALGA 160.

Mounting semiconductor die 104 with micro pillars 122 directly to conductive layer 144 of substrate 140 minimizes interconnect distance, which increases package speed. Electrically connecting multiple semiconductor die over substrate 140 increase the performance and functionality of DCALGA 160. Mounting semiconductor die 104 with micro pillars 122 directly to conductive layer 144 of substrate 140 minimizes package parasitic elements, e.g., parasitic RLC. In one embodiment, fusible layer 120 of micro pillars 122 is comprised of lead-free materials to provide a green, environmentally friendly, interconnect structure. Further, the first reflow of fusible portions 120 is performed after disposing semiconductor die 104 over the substrate 140. Eliminating a reflow operation at the wafer level, i.e., prior to singulating semiconductor wafer 100, reduces manufacturing time and increases device reliability, as reducing the number of reflow operations performed over semiconductor die 104 reduces the number of heating cycles semiconductor die 104 is subjected to. Minimizing the number of heating cycles preformed over semiconductor die 104 reduce the risk of warpage and device failures. Heat spreader 162 further increases the thermal performance and reliability of DCALGA 160. DCALGA 160 provides a thinner package with increased reliability, faster performance speeds, a simplified manufacturing process, and decreased costs.

Figure 8:
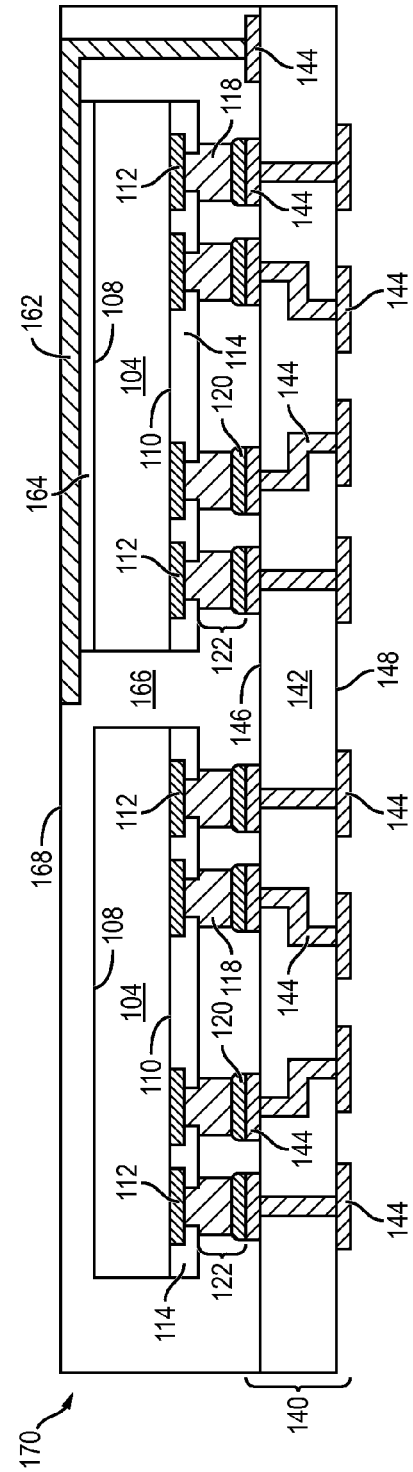
FIG. 8 illustrates a DCALGA package including an exposed heat spreader and multiple semiconductor die with micro pillars.

FIG. 8 illustrates a DCALGA package 170 having multiple semiconductor die 104 with micro pillars 122 and an exposed heat spreader 162. In DCALGA package 170, a portion of MUF material 166 is removed in a backgrinding operation. The backgrinding operation reduces a thickness of MUF material 166 over back surface 108 of semiconductor die 104 and exposes heat spreader 162. After backgrinding, surface 168 of MUF material 166 is coplanar with the surface of heat spreader 162. Alternatively, the deposition of MUF material 166 is controlled to prevent MUF material 166 from flowing over heat spreader 162. Exposed heat spreader 162 dissipates heat generated by semiconductor die 104. Heat spreader 162 can be disposed over one or all of the semiconductor die 104 in DCALGA 170. Exposed heat spreader 162 increases the thermal performance and reliability of DCALGA 170. After depositing MUF material 166, a saw blade or laser cutting device, similar to cutting device 152, is used to cut through MUF material 166 and substrate 140 and singulate individual DCALGA packages 170.

FIG. 8 shows DCALGA package 170 after singulation. Semiconductor die 104 are electrically connected through conductive layers 144. Conductive layers 144 provide electrical interconnect laterally across and vertically through substrate 140 according to the design and function of semiconductor die 104. Portions of conductive layer 144 on surface 148 of substrate 140 form LGA leads and provide interconnection between DCALGA package 170 and external devices, for example, a PCB. Semiconductor die 104 are used by way of example in the present embodiment, semiconductor die 130 from FIG. 3 and/or semiconductor die 134 from FIG. 4 could also be used to form DCALGA package 170.

Non-fusible pillars 118 of micro pillars 122 are fixed to contact pads 112 of semiconductor die 104. Fusible layer 120 of micro pillars 122 is disposed between conductive pillars 118 and contact pads 144 on surface 146 of substrate 140. Reflowed fusible layer 120 form electrical and metallurgical connections between conductive pillars 118 and contact pads 144. Non-fusible pillars 118 do not melt or deform during reflow. Non-fusible pillars 118 provide a fixed offset between semiconductor die 104 and surface 146 of substrate 140. Reflowing only fusible layer 120 allows the pitch of micro pillars 122 to be reduced. Melting only fusible layer 120, as opposed to the entire interconnect structure, i.e., conductive pillars 118 and fusible layer 120, reduces a volume of liquidus material during reflow and prevents melted material from spreading between adjacent traces of conductive layer 144 during reflow. Melting only fusible layer 120 decreases an occurrence of electrical shorts and increases the reliability of DCALGA 170. The decreased pitch of micro pillars 122 also allows a greater number of micro pillars 122 to be formed over semiconductor die 104. Accordingly, semiconductor die and devices with increased input/output density requirements can be incorporated into DCALGA 170.

Substrate 140 does not require a solder resist or solder mask over conductive layer 144 and surface 146 of substrate 140, as the small amount of fusible material 120 employed by micro pillar 122 does not run a risk spreading between adjacent traces of conductive layer 144 during reflow, i.e., melted material of fusible layer 120 will not form conductive bridges or shorts between adjacent traces of conductive layer 144. Eliminating the need to form a solder mask over substrate 140 simplifies the manufacturing process for substrate 140. Eliminating the need to form a solder mask over substrate 140 decreases manufacturing time and costs, which increase throughput. Eliminating a solder mask layer also reduces the thickness of 140 substrate and an overall thickness of DCALGA 170.

Mounting semiconductor die 104 with micro pillars 122 directly to conductive layer 144 of substrate 140 minimizes interconnect distance, which increases package speed. Electrically connecting multiple semiconductor die over substrate 140 increase the functionality and overall performance of DCALGA 170. Mounting semiconductor die 104 having micro pillars 122 directly to conductive layer 144 minimizes package parasitic elements, e.g., parasitic RLC. In one embodiment, fusible layer 120 of micro pillars 122 is comprised of lead-free materials and provides a green, environmentally friendly, interconnect structure. Further, the first reflow of fusible portions 120 is performed when semiconductor die 104 are mounted to the substrate 140. Eliminating a reflow operation at the wafer level, i.e., prior to singulating semiconductor wafer 100, reduces manufacturing time and increases device reliability, as reducing the number of reflow operations performed over semiconductor die 104 minimizes the number of heating cycles semiconductor die 104 is subjected to. Minimizing the number of heating cycles performed over semiconductor die 104 reduces the risk of warpage and device failures. Exposed heat spreader 162 dissipated heat generated by semiconductor die 104 and increases the thermal performance and reliability of DCALGA 170. Thus, DCALGA 170 provides a thinner package having increased reliability, faster performance speeds, and a simplified manufacturing process with decreased costs.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate;
   providing a first semiconductor die including a first contact pad formed over the first semiconductor die;
   forming an insulating layer including a first opening formed through the insulating layer to expose the first contact pad, wherein a width of the first opening is smaller than a width of the first contact pad;
   depositing a mask layer over the first semiconductor die;
   forming a second opening in the mask layer over the first contact pad, wherein a width of the second opening is larger than the width of the first opening;
   depositing copper within the first opening and second opening directly on the first contact pad to form a copper pillar, wherein the copper pillar contacts a top surface of the insulating layer and a vertical surface of the insulating layer within the first opening;
   depositing a solder layer directly on the copper within the second opening;
   removing the mask layer from the first semiconductor die;
   disposing the first semiconductor die over the substrate with the solder layer contacting a second contact pad on the substrate;
   disposing a second semiconductor die over the substrate;
   reflowing the solder layer onto the second contact pad;
   depositing an encapsulant around the first semiconductor die and second semiconductor die, wherein the encapsulant contacts the copper pillar, solder layer, and second contact pad; and
   cutting through the encapsulant and substrate to singulate the first semiconductor die and second semiconductor die into individual semiconductor packages.

2. The method of claim 1, wherein the substrate includes a leadframe.

3. The method of claim 1, further including:
   forming a conductive layer over the first semiconductor die; and
   forming the first contact pad as part of the conductive layer, where the conductive layer extends from the first contact pad toward a center of the first semiconductor die.

4. The method of claim 1, further including disposing a heat spreader over the first semiconductor die.

5. The method of claim 4, further including removing a portion of the encapsulant from over the heat spreader.

6. The method of claim 1, wherein the solder layer is a lead-free solder.

7. The method of claim 1, further including singulating the first semiconductor die from a semiconductor wafer after forming the copper pillar and solder layer.

8. A method of making a semiconductor device, comprising:
   providing a substrate;
   providing a first semiconductor die including a contact pad formed over the first semiconductor die;
   forming an insulating layer over the first semiconductor die including an opening in the insulating layer over the contact pad;
   forming a copper pillar directly on the contact pad and physically contacting the insulating layer;
   depositing a solder layer directly on the copper pillar;
   reflowing the solder layer onto the substrate;
   depositing an encapsulant over the substrate and first semiconductor die, wherein the encapsulant contacts the copper pillar and solder layer; and
   cutting through the encapsulant and substrate.

9. The method of claim 8, further including:
   disposing a second semiconductor die over the substrate; and
   cutting through the encapsulant and substrate between the first semiconductor die and second semiconductor die.

10. The method of claim 8, further including disposing a heat spreader over the first semiconductor die.

11. The method of claim 8, wherein the substrate includes a leadframe.

12. The method of claim 8, further including forming a shielding layer over the first semiconductor die.

13. The method of claim 8, wherein the copper pillar extends into the opening of the insulating layer to physically contact the contact pad.

14. A method of making a semiconductor device, comprising:
   providing a substrate;
   providing a first semiconductor die including,
      a contact pad formed over the first semiconductor die, and
      an insulating layer formed over the first semiconductor die with an opening in the insulating layer over the contact pad;
   forming a conductive pillar directly on the contact pad and in physical contact with the insulating layer;
   forming a solder layer directly on the conductive pillar;
   reflowing the solder layer to metallurgically connect the first semiconductor die to the substrate;
   disposing a second semiconductor die over the substrate;
   depositing an encapsulant around the first semiconductor die, second semiconductor die, and conductive pillar; and
   singulating through the encapsulant and substrate.

15. The method of claim 14, further including depositing the encapsulant between the substrate and an active surface of the first semiconductor die, wherein the encapsulant contacts the conductive pillar.

16. The method of claim 15, further including depositing the encapsulant to cover a side surface of the first semiconductor die.

17. The method of claim 14, further including:
　disposing a heat spreader over the first semiconductor die; and
　depositing the encapsulant around the heat spreader.

18. The method of claim 17, further including removing a portion of the encapsulant to expose the heat spreader.

19. The method of claim 14, further including forming the conductive pillar over the first semiconductor die by:
　forming a patterning layer over the first semiconductor die including an opening of the patterning layer exposing a contact pad of the first semiconductor die; and
　depositing copper within the opening of the patterning layer directly on the contact pad.

20. The method of claim 14, further including forming the conductive pillar to include a width of the conductive pillar that is greater than a width of the opening in the insulating layer.

21. A method of making a semiconductor device, comprising:
　providing a substrate;
　providing a first semiconductor die including a contact pad formed over the first semiconductor die;
　forming an insulating layer over the first semiconductor die including an opening in the insulating layer over the contact pad, wherein a width of the opening is smaller than a width of the contact pad;
　forming a copper pillar directly on the contact pad in the opening, wherein a width of the copper pillar above the opening is greater than the width of the opening;
　forming a solder layer directly on the copper pillar;
　depositing an encapsulant between the first semiconductor die and substrate with the encapsulant extending over a surface of the first semiconductor die opposite the substrate; and
　cutting through the substrate and encapsulant around the first semiconductor die.

22. The method of claim 21, further including forming the copper pillar and solder layer using a single patterning layer.

23. The method of claim 21, further including disposing a shielding layer over the first semiconductor die.

24. The method of claim 21, further including:
　disposing a heat spreader over the first semiconductor die; and
　depositing the encapsulant over the heat spreader.

25. The method of claim 24, further including removing a portion of the encapsulant to expose the heat spreader.

\* \* \* \* \*